US006301283B1

(12) United States Patent
Chen et al.

(10) Patent No.: US 6,301,283 B1
(45) Date of Patent: Oct. 9, 2001

(54) DISTRIBUTED FEEDBACK SEMICONDUCTOR LASER

(75) Inventors: Nong Chen; Kiyoshi Takei; Yoshiaki Watanabe; Kiyofumi Chikuma, all of Saitama (JP)

(73) Assignee: Pioneer Electronic Corporation, Tokyo (JP)

( * ) Notice: Subject to any disclaimer, the term of this patent is extended or adjusted under 35 U.S.C. 154(b) by 0 days.

(21) Appl. No.: 09/237,890

(22) Filed: Jan. 27, 1999

(30) Foreign Application Priority Data

Jan. 28, 1998 (JP) .................................................. 10-030546

(51) Int. Cl.⁷ ....................................................... H01S 5/12
(52) U.S. Cl. ................................................. 372/96; 372/46
(58) Field of Search ......................................... 372/46, 96

(56) References Cited

U.S. PATENT DOCUMENTS

| 5,155,737 | * | 10/1992 | Ikeda et al. ............................. 372/43 |
| 5,493,438 | | 2/1996 | Gay et al. ............................. 359/246 |
| 5,737,474 | | 4/1998 | Aoki et al. ............................. 385/131 |
| 5,982,804 | * | 11/1999 | Chen et al. ............................. 372/96 |
| 6,238,943 | * | 5/2001 | Kobayashi et al. .................... 438/31 |

FOREIGN PATENT DOCUMENTS

| 05-257018 | 10/1993 | (JP) . |
| 06-326404 | 11/1994 | (JP) . |
| 06-326418 | 11/1994 | (JP) . |
| 08-116124 | 5/1996 | (JP) . |

OTHER PUBLICATIONS

N. Chen, et al. "Analysis, Fabrication, and Characterization of Tunable DFB Lasers with Chirped Gratings," IEEE Journal of Selected Topics in Quantum Electronics, vol. 3, No. 2, pp. 541–546, Apr. 1997.

H. Hillmer, et al. "Continuously Chirped DFB Gratings by Specially Bent Wavegides for Turnable Lasers," Journal of Lightwave Technology, vol. 13, No. 9, pp. 1905–1911, Sep. 1995.

Y. Kotaki, et al. "Wavelength Tunable Semiconductor Lasers," The Transactions of the IEICE, vol. J73–C–I, No. 5, pp.253–260, May 1990.

\* cited by examiner

*Primary Examiner*—James W. Davie
(74) *Attorney, Agent, or Firm*—Morgan, Lewis & Bockius LLP (57) ABSTRACT

A distributed feedback semiconductor laser including a semiconductor substrate having a bottom surface and a top surface; an active layer formed on the top surface of the semiconductor substrate; a ridge stripe formed on the active layer having a first surface and extending in a first direction; a periodic structure that is periodic in the first direction; a plurality of p-type electrodes formed on the first surface of the ridge stripe; and an n-type electrode formed on the bottom surface of the semiconductor substrate. The first surface of the ridge stripe is parallel with a growth plane of the active layer, the first surface having at least two different widths in a direction perpendicular to the first direction.

20 Claims, 11 Drawing Sheets

DISTRIBUTED FEEDBACK SEMICONDUCTOR LASER

This application claims the benefit of Japanese Patent Application No. 10-30546, filed Jan. 28, 1998, which is hereby incorporated by reference.

BACKGROUND OF THE INVENTION

1. Field of the Invention

The present invention relates to a semiconductor laser, and more particularly, to a distributed feedback semiconductor laser (hereinafter referred to as a DFB semiconductor laser) having a wavelength varying function.

2. Discussion of the Related Art

The DFB semiconductor laser is known as a device that has various applications in optical communication systems such as in optical cable television (CATV) technology, pumping light sources of an SHG short-wavelength laser for high-density information recording and of a small size solid-state laser, optical measurements, and the like. The conventional DFB semiconductor laser is commonly manufactured by a 2-stage (or more) epitaxial growth. Such DFB lasers are manufactured by forming a diffraction grating on a waveguide layer and then growing other layers epitaxially on the waveguide.

To avoid the complexity involved with an epitaxial growth of two or more stages, DFB semiconductor lasers have been developed that are manufactured having a 1-stage epitaxial growth. In recent years, the importance of providing such DFB semiconductor lasers with variable oscillation wavelengths has continued to increase.

Accordingly, DFB semiconductor lasers having variable oscillation wavelengths incorporating a chirped diffraction grating structure have been proposed. The chirped diffraction grating structure is classified into, for example, (a) a structure in which the diffraction grating of a DFB semiconductor laser is given a non-uniform pitch, and (b) a structure in which the diffraction grating of a DFB semiconductor laser is given a constant pitch and a bent waveguide is formed on a waveguide layer. The oscillation wavelength is varied in those manners.

However, method (a) requires a complex and difficult laser manufacturing process and hence it is not suitable for mass-production because a non-uniform diffraction grating needs to be formed. Method (b) results in a large loss of light because the light traveling direction is not perpendicular to the diffraction grating.

SUMMARY OF THE INVENTION

Accordingly, the present invention is directed to a distributed feedback ("DFB") semiconductor laser and manufacturing method that substantially obviates one or more of the problems due to limitations and disadvantages of the related art.

An objective of the present invention is to provide a DFB semiconductor laser that is capable of varying its oscillation wavelength, has a simple structure, is easy to manufacture and suitable for mass production, and results in a small loss of light.

Additional features and advantages of the present invention will be set forth in the description which follows, and will be apparent from the description, or may be learned by practice of the invention. The objectives and other advantages of the invention will be realized and attained by the structure and process particularly pointed out in the written description and claims hereof as well as the appended drawings.

To achieve these and other advantages and in accordance with the purpose of the present invention, as embodied and broadly described, a distributed feedback semiconductor laser of the present invention includes a semiconductor substrate having a bottom surface and a top surface; an active layer formed on the top surface of the semiconductor substrate; a ridge stripe formed on the active layer and having a first surface and extending in a first direction; a periodic structure that is periodic in the first direction; a plurality of p-type electrodes formed on the first surface of the ridge stripe; and an n-type electrode formed on the bottom surface of the semiconductor substrate, wherein the first surface of the ridge stripe is parallel with a growth plane of the active layer, the first surface having at least two different widths in a direction perpendicular to the first direction.

In another aspect, the present invention provides a distributed feedback semiconductor laser that includes a semiconductor substrate; a first cladding layer formed on the semiconductor substrate; a first guide layer formed on the first cladding layer; an active layer formed on the first guide layer; a second guide layer formed on the active layer; a second cladding layer formed on the second guide layer; a contact layer formed on the second cladding layer; a ridge stripe, including the second cladding layer and the contact layer, extending in a light emitting direction; a diffraction grating formed on the second cladding layer; a plurality of p-type electrodes formed on the ridge stripe; and an n-type electrode formed on a bottom surface of the semiconductor substrate, wherein the ridge stripe has at least two different widths in a direction perpendicular to a ridge stripe extending direction.

In a further aspect of the present invention, a method of manufacturing a distributed feedback semiconductor laser includes the steps of forming a first cladding layer on a semiconductor substrate; forming a first guide layer on the first cladding layer; forming an active layer on the first guide layer; forming a second guide layer on the active layer; forming a second cladding layer on the second guide layer; forming a contact layer on the second cladding layer; providing a ridge stripe, including the second cladding layer and the contact layer, extending in a light emitting direction; forming a diffraction grating on the second cladding layer; forming a plurality of p-type electrodes on the ridge stripe; and forming an n-type electrode on a bottom surface of the semiconductor substrate, wherein the step of providing a ridge stripe includes the step of providing the ridge stripe with at least two different widths in a direction perpendicular to a ridge stripe extending direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DESCRIPTION OF THE PREFERRED EMBODIMENTS

Reference will now be made in detail to the preferred embodiments of the present invention, examples of which are illustrated in the accompanying drawings.

In the present invention, an InGaAsP/InP-type DFB semiconductor laser is formed on an indium phosphorus (hereinafter referred to as InP) substrate by, for example, an organic metal compound growth method (MOCVD) using an organic metal compound gas as a material, and is characterized by layers that constitute a ridge stripe.

The device structure, manufacturing method, and various characteristics of a DFB semiconductor laser according to the invention will be hereinafter described with reference to the accompanying drawings.

(I) Device Structure of DFB Semiconductor Laser

Figure 1:
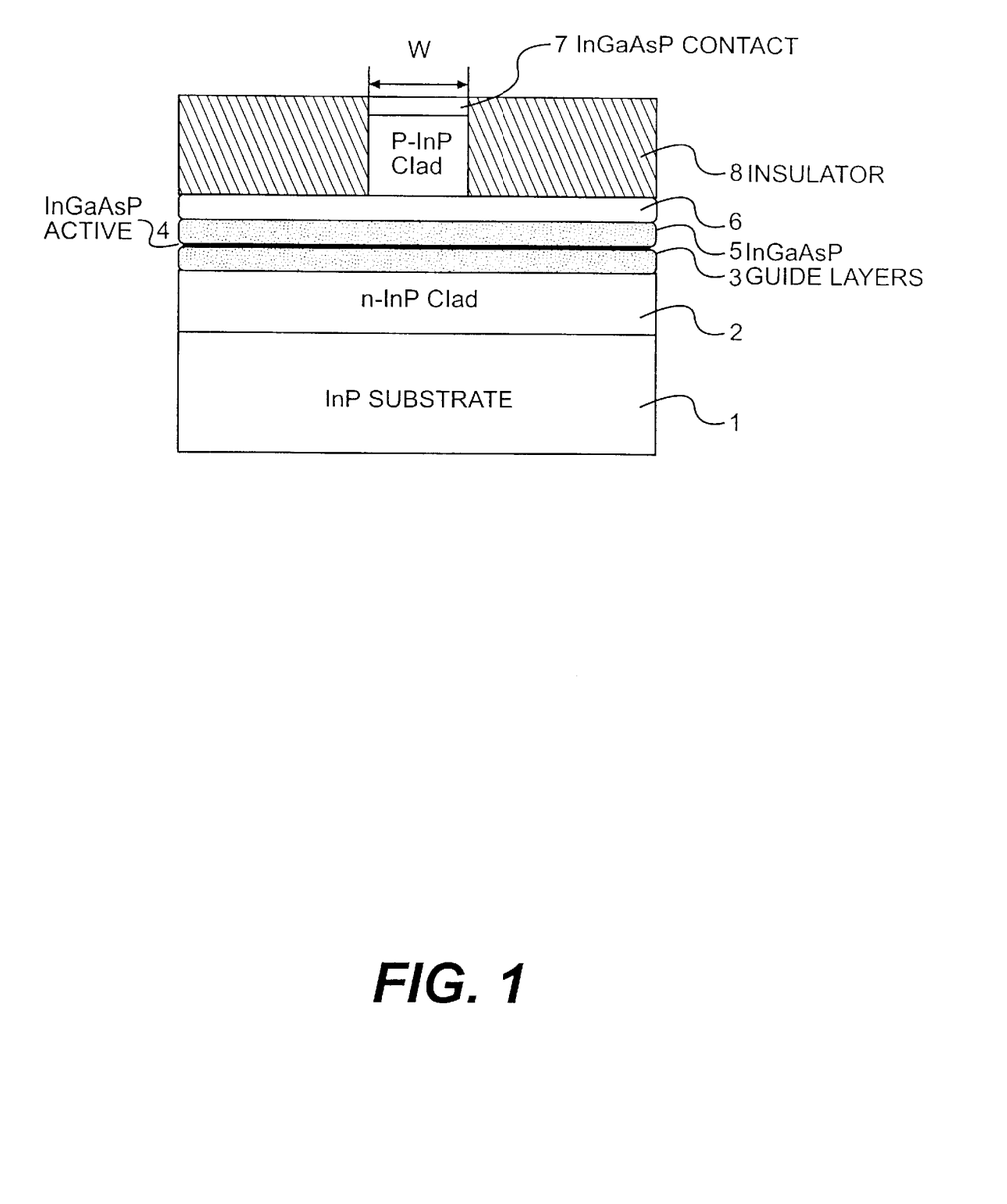
FIG. 1 is a sectional view of a distributed feedback ("DFB") semiconductor laser (before electrode formation) according to an embodiment of the present invention.

FIG. 1 is a sectional view of a DFB semiconductor laser according to an embodiment of the present invention. In FIG. 1, reference numerals 1 and 2 denote a substrate of InP and a cladding layer of n-InP, respectively. Reference numerals 3 and 5 denote guide layers of InGaAsP for confinement of light in an InGaAsP active layer 4. Numeral 6 denotes a cladding layer of p-InP that constitutes a ridge stripe. Numeral 7 denotes a contact layer of p-InGaAsP or p-InGaAs that constitutes the ridge stripe. Numeral 8 denotes insulator layers made of $SiO_2$ or the like.

The above-described layers are grown so as to be laid one on another in the order shown in FIG. 1, whereby a laser substrate having a laser structure is formed.

Although not shown in FIG. 1, a diffraction grating 9 is formed on the guide layer 5 in a pitch corresponding to an oscillation wavelength. The diffraction grating 9 is formed by electron beam lithography (described later) or the like.

Figure 2:
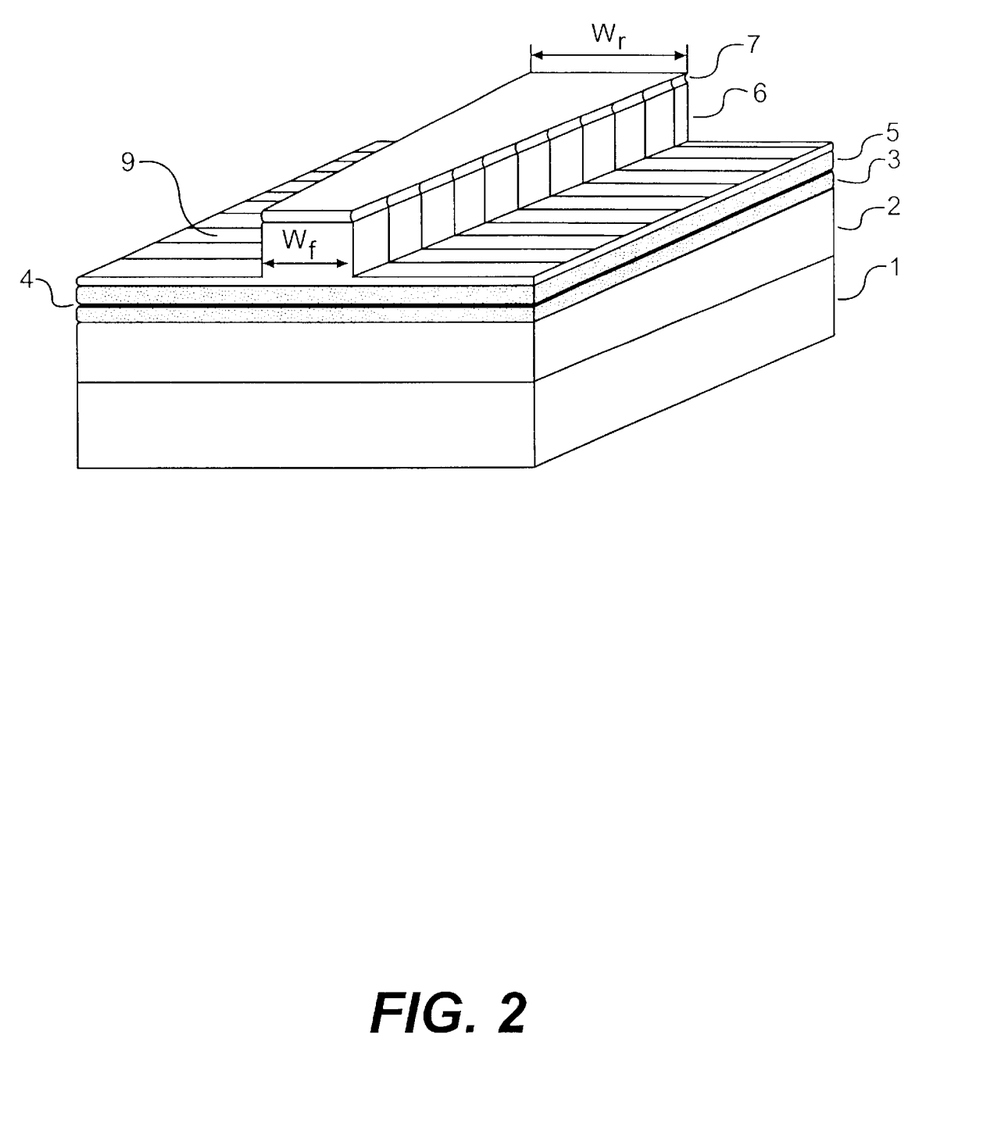
FIG. 2 is a perspective view of the DFB semiconductor laser of FIG. 1.

FIG. 2 is a perspective view of the DFB semiconductor laser of FIG. 1. In this embodiment, respective surfaces, parallel with the growth planes, of the cladding layer 6 and the contact layer 7 that constitute the ridge stripe have an approximately trapezoidal shape whose bases are perpendicular to the ridge stripe extending direction, that is, the laser light emission direction. That is, a ridge stripe width $W_f$ of the end face from which laser light is emitted and a ridge stripe width $W_r$ of the opposite end face are base lengths of the approximately trapezoidal shape. Although not shown in FIG. 2, the insulator layers 8 occupy both sides of the cladding layer 6 and the contact layer 7.

Figure 8:
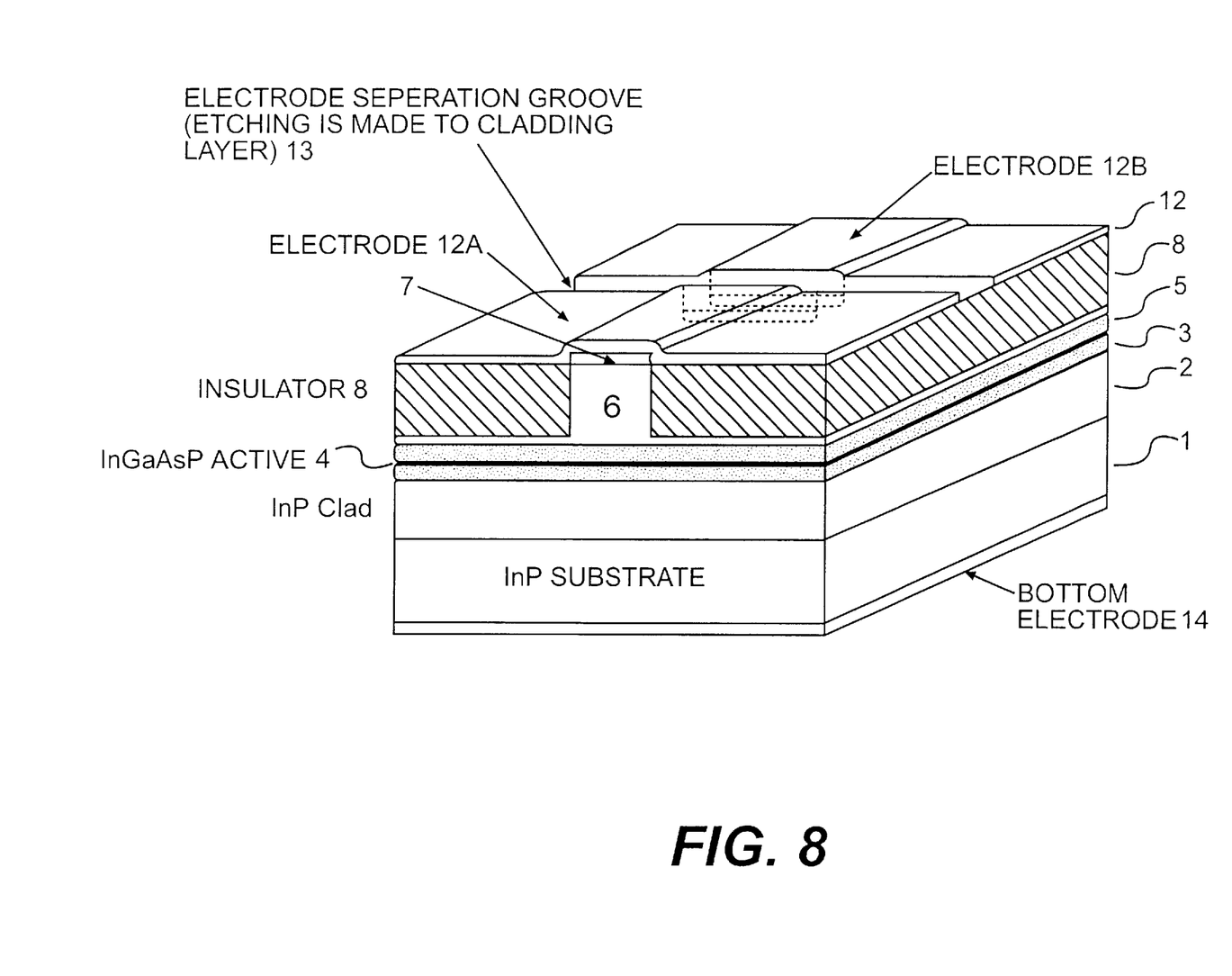

In the DFB semiconductor laser of FIG. 2, laser light is emitted from the portion of the end face having the ridge stripe width $W_f$ in the vicinity of the active layer 4. The laser light emission end face is made having a non-reflective surface and the end face opposite to it is formed with a high-reflectance film. As shown in FIG. 2, the lines of the diffraction grating 9 are formed at a predetermined constant pitch so as to extend in a direction approximately perpendicular to the laser light emission direction. FIGS. 1 and 2 show a state before electrode formation. A final form of the DFB semiconductor laser is as shown in FIG. 8.

Manufacturing Method of DFB Semiconductor Laser

FIGS. 3–4 and 6–8 illustrate steps of a DFB semiconductor laser manufacturing method according to the invention.

(a) Lamination Step

Figure 3:
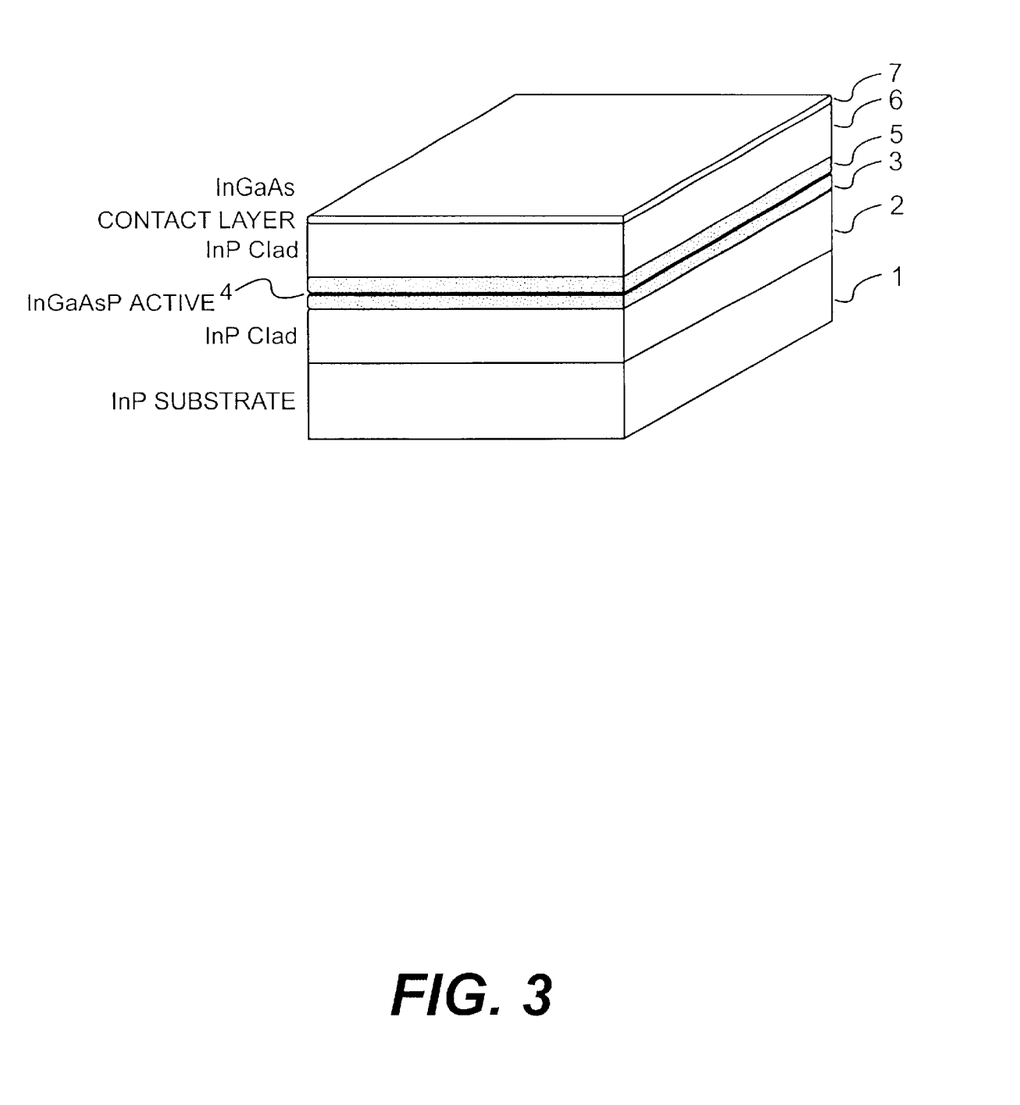
FIGS. 3 and 4 illustrate steps of a manufacturing process of a DFB semiconductor laser according to an embodiment of the present invention.

First, as shown in FIG. 3, an InP substrate 1 is prepared and its surface is cleaned by chemical etching. Then SCH (separate confinement heterostructure) regions 3–5, and a cladding layer 6 and a contact layer 7 that later constitute a ridge stripe are formed by a prescribed epitaxial growth method (liquid-phase growth, organic metal vapor-phase growth, molecular beam growth, or the like). In the invention, for example, the materials shown in FIGS. 1 and 3 are used.

(b) Ridge Stripe Forming Step

Figure 4:
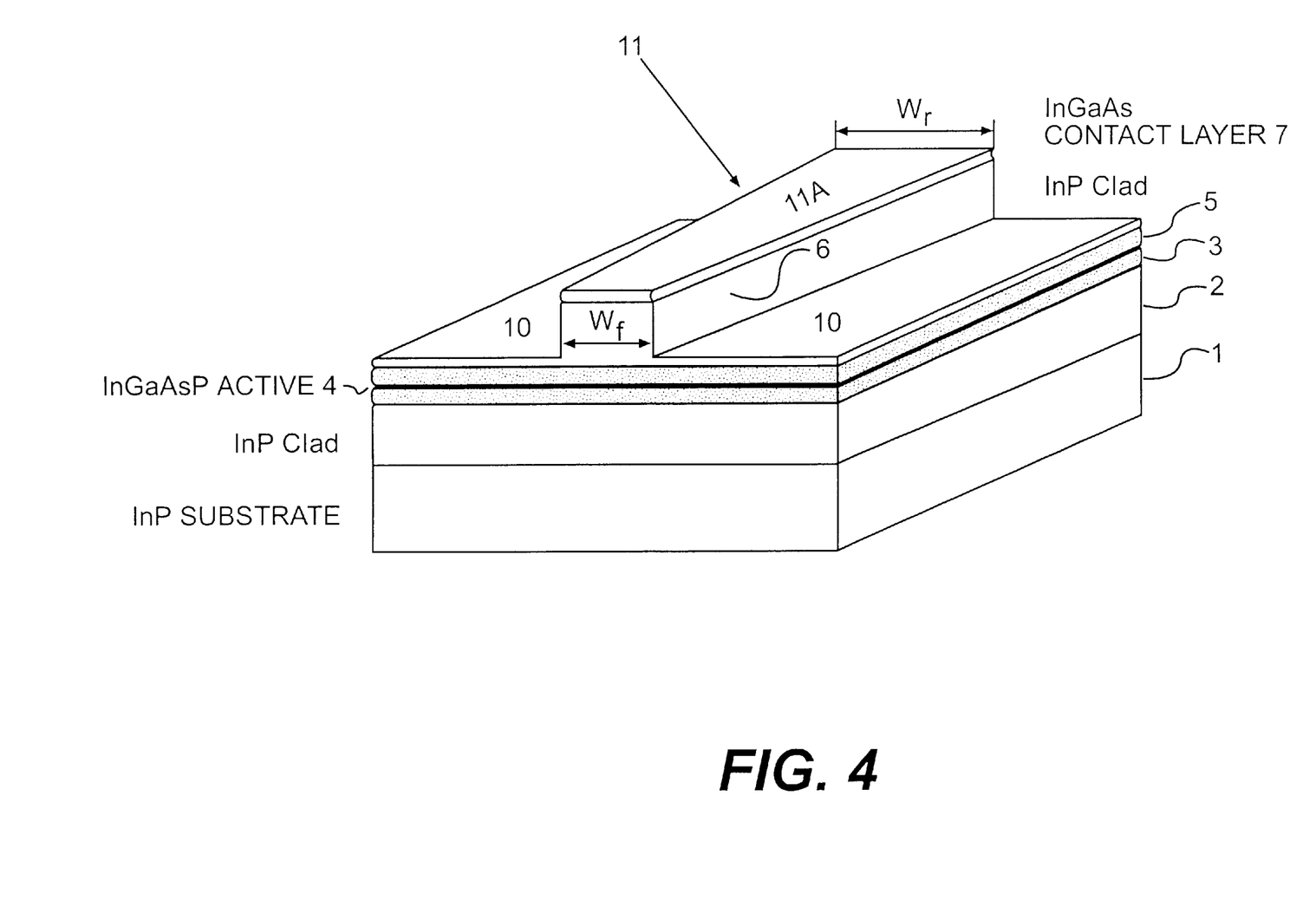
Figure 5:
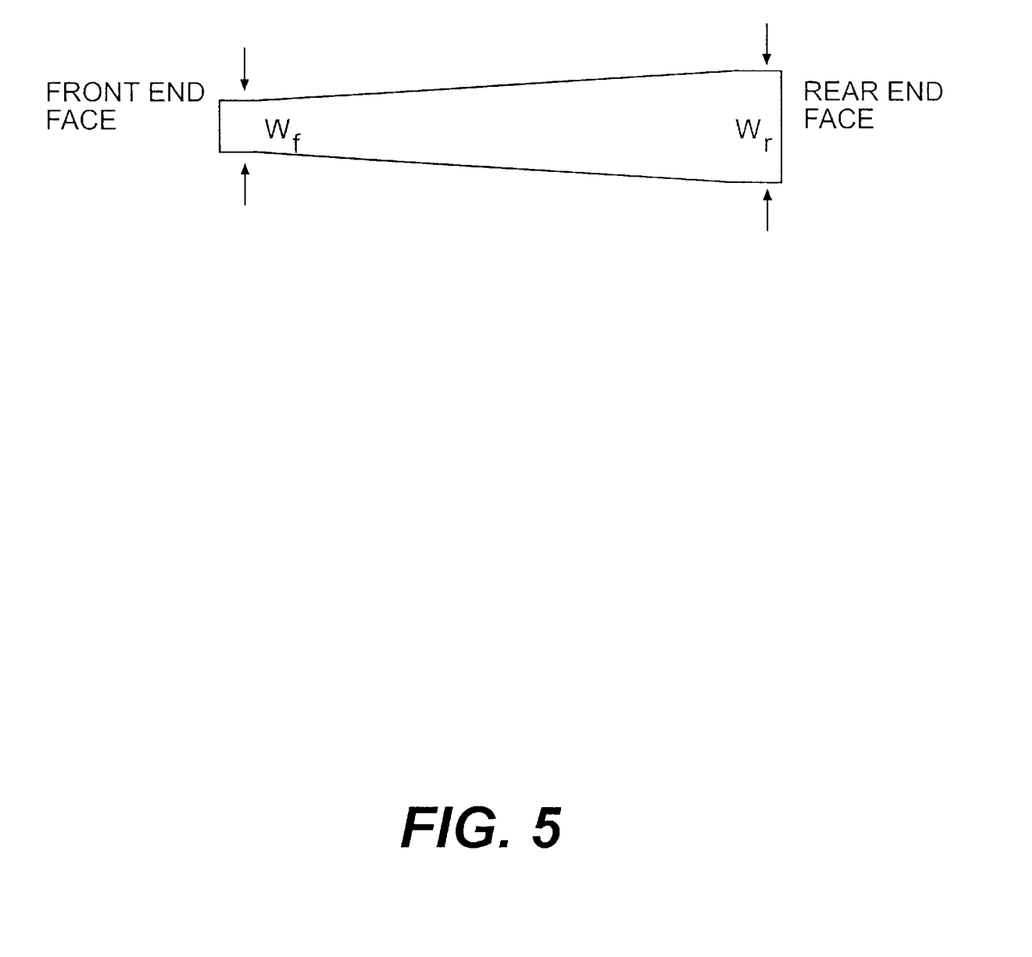
FIG. 5 illustrates the shape of a ridge stripe of a DFB semiconductor laser according to the present invention.

Next, as shown in FIG. 4, a prescribed stripe mask of $SiO_2$, $TiO_2$, or the like is formed, by photolithography or the like, on the contact layer 7 so that a ridge stripe will extend in the laser light emission direction. The portions of the cladding layer 6 and the contact layer 7 excluding the portions where the stripe mask has been formed are etched out, whereby a ridge stripe 11 having side flat portions 10 and a flat top portion 11A is formed. In the invention, as shown in FIG. 5, the prescribed stripe mask is formed so that the respective surfaces, parallel with the growth planes, of the cladding layer 6 and the contact layer 7 that will constitute a ridge stripe will have an approximately trapezoidal shape whose bases are perpendicular to the laser light emission direction. That is, the stripe mask is formed so that a stripe mask width $W_f$ at the front end face from which laser light is to be emitted and a stripe mask width $W_r$ at the opposite, rear end face will be base lengths of an approximately trapezoidal shape. The stripe mask may be formed so as to assume an exact trapezoid rather than an approximately trapezoidal shape.

As for the resulting ridge stripe, a relationship $W_f < W_r$ holds.

The stripe mask is removed after execution of this step.

(c) Diffraction Grating Forming Step

Figure 6:
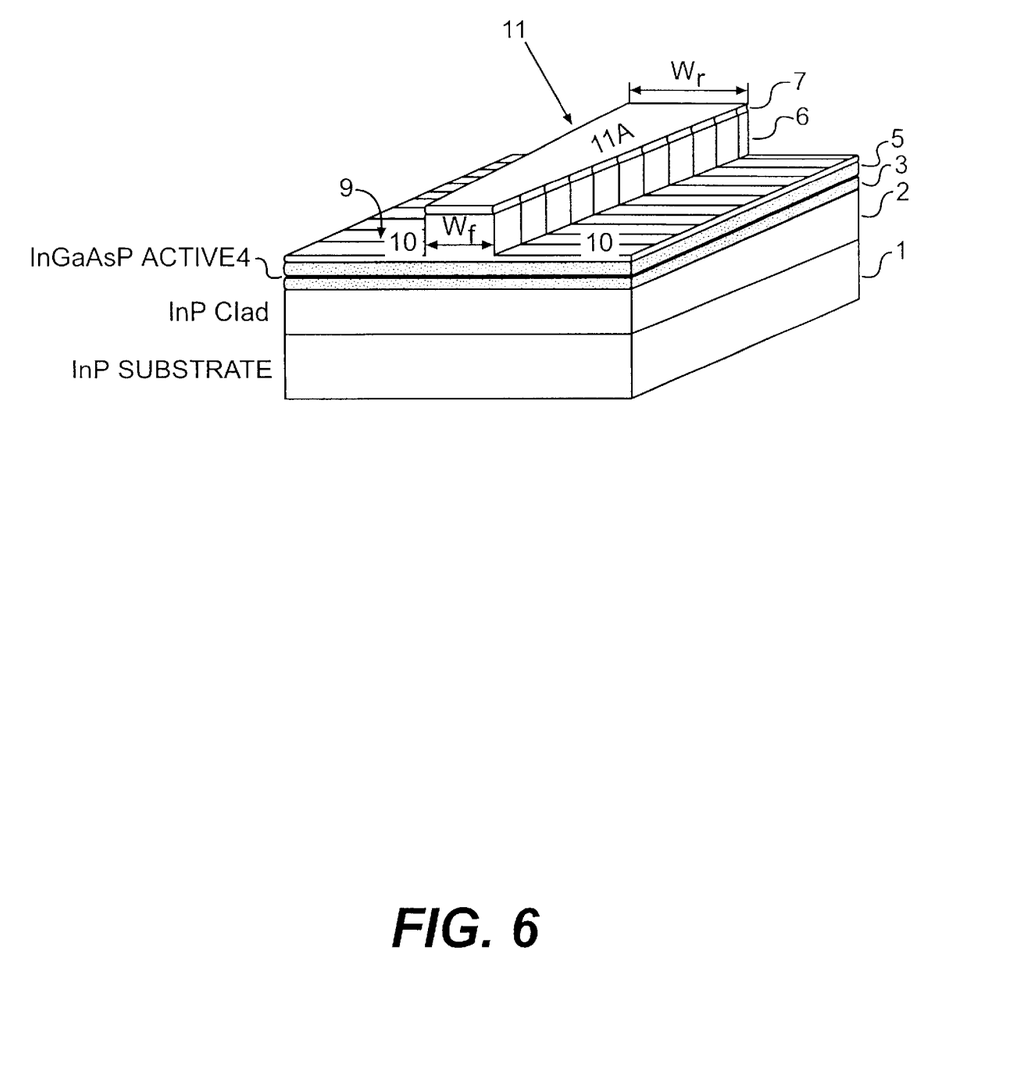
FIGS. 6–8 illustrates steps of a manufacturing process of a DFB semiconductor laser according to the present invention.

In the invention, a diffraction grating 9 is formed by, for example, electron beam lithography. First, a protective film (not shown) of $SiO_2$ or the like is formed so as to cover the side flat portions 10 and the flat top portion 11A. Next, a resist layer (not shown) is formed by coating the protective film on the side flat portions 10 and the flat top portion 11A with an electron beam resist and then performing a heat treatment. Then, as shown in FIG. 6, a diffraction grating pattern having a pitch A in the ridge stripe extending direction (resonator direction) is formed on the resist layer by drawing, with an electron beam, lines in the direction perpendicular to the laser light emission direction. The pitch A corresponds to a desired laser oscillation wavelength.

The diffraction grating pattern of the resist layer is transferred to the $SiO_2$ protective film by $CF_4$ dry etching. A diffraction grating 9 is then formed in the side flat portions 10 by wet-etching the side flat portions 10 selectively with a hydrochloric acid type etchant. The protective film is thereafter removed.

Although in FIG. 6 the diffraction grating 9 is also formed in the side faces of the ridge stripe, it may instead be formed only in the side flat portions 10. Furthermore, although in this embodiment both dry etching and wet etching are employed in the diffraction grating forming step, it is possible to instead employ only dry etching. In such a case, the stripe mask that was used in the ridge stripe forming step is left even after the formation of the ridge stripe 11 and removed after completion of the dry etching.

In general, in the DFB semiconductor laser, a periodic structure that varies at a pitch $\Lambda$ in the laser light traveling direction, and hence the refractive index also varies periodically and laser oscillation occurs at a wavelength at which the reflectance of light reflected periodically is high (Bragg reflection). Therefore, the oscillation wavelength of the DFB semiconductor laser is determined by the pitch $\Lambda$ of the periodic structure and the refractive index n. In general, a single longitudinal mode is obtained when a Bragg condition $$\Lambda = m\lambda/2n \quad (1)$$

is satisfied, where m is an integer, $\lambda$ is an oscillation wavelength (in a vacuum), and n is the refractive index of the semiconductor laser medium.

(d) Electrode Forming Step

Figure 7:
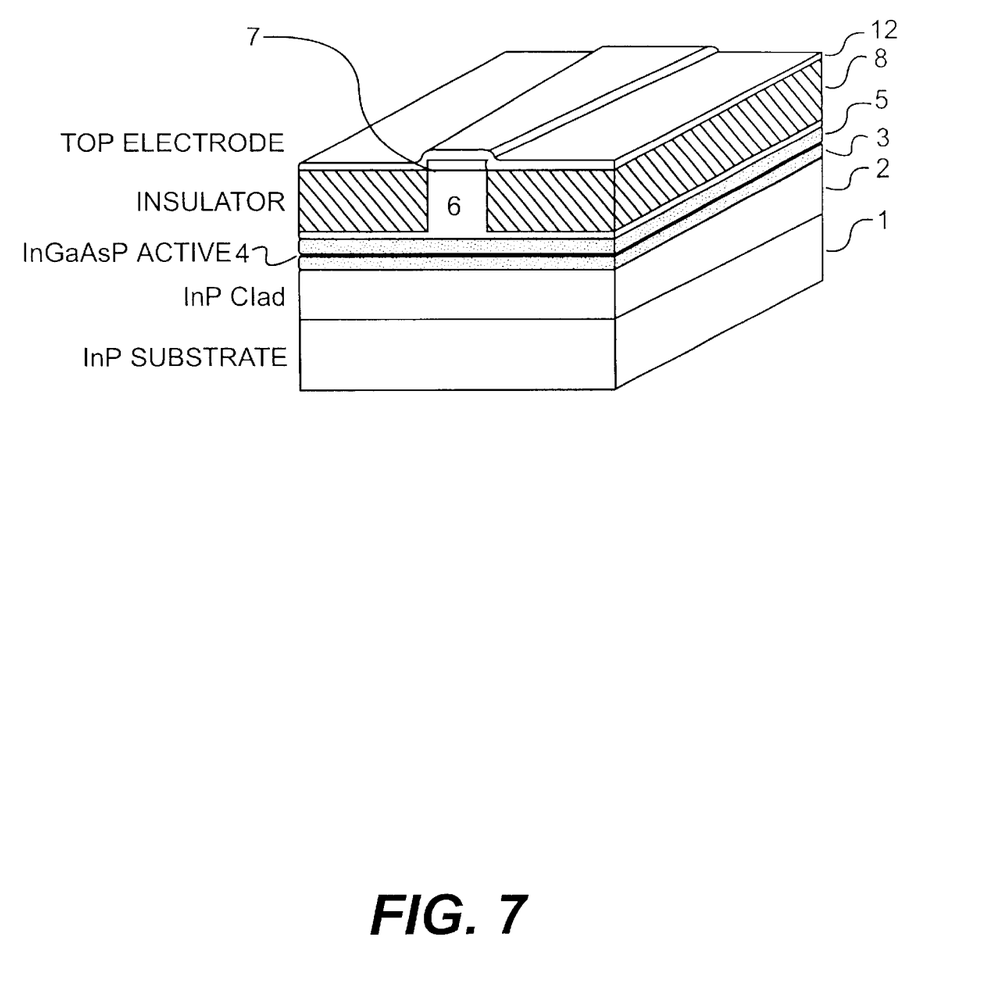

As shown in FIG. 7, an insulator layer 8 of $SiO_2$ or the like is formed so as to entirely cover the ridge stripe 11 and the diffraction grating 9, and is then removed partially until the flat top portion 11A is exposed. A top p-type electrode 12 is formed by depositing an alloy metal such as Au/Zn on the exposed flat top portion 11A of the contact layer 7 and the insulator layers 8.

Finally, as shown in FIG. 8, the p-type cladding layer 6, the contact layer 7, and the top p-type electrode 12 are divided by etching approximately at the middle position in the laser light emission direction. As a result, an electrode separation groove 13 is formed and the top p-type electrode 12 is divided into p-type electrodes 12A and 12B.

The top p-type electrode 12 is divided for a wavelength varying control (described later). The number of divisions is not limited to two and is determined properly in accordance with the wavelength varying method. That is, the intended operation is obtained by forming electrodes in portions having different ridge stripe widths.

Although in this embodiment the p-type cladding layer 6, the contact layer 7, and the top p-type electrode 12 are divided, only the contact layer 7 and the top p-type electrode 12 may be divided. Then, a bottom n-type electrode layer 14 is formed by depositing an alloy metal such as Au/Ge on the bottom surface of the substrate 1. A DFB semiconductor laser is thus completed.

The principle of wavelength varying of the DFB semiconductor laser manufactured by the above method will be described below in detail.

Figure 9:
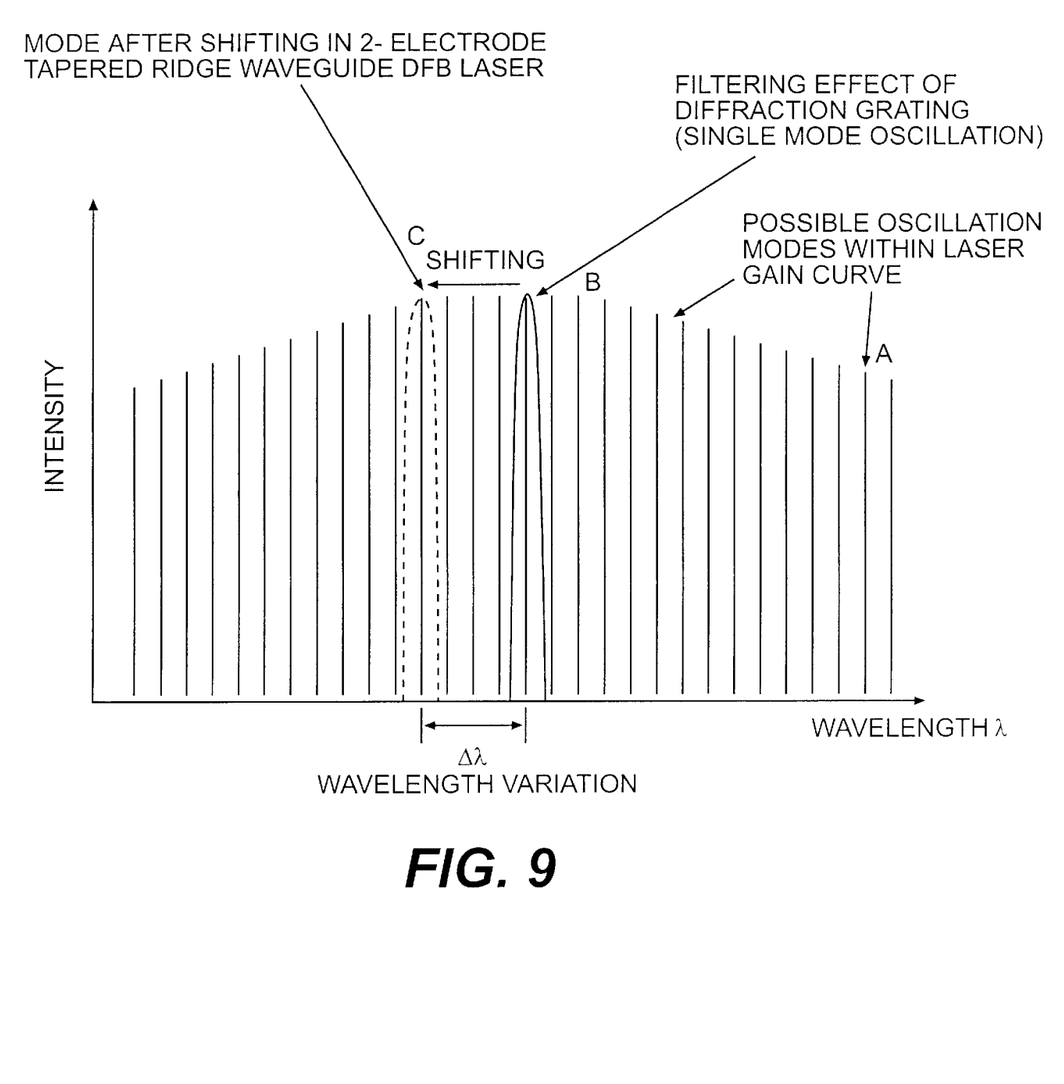
FIG. 9 is a graph showing oscillation wavelength vs. relative intensity spectrum of the DFB semiconductor laser of the present invention.

FIG. 9 is a graph showing how the oscillation wavelength is shifted in the DFB semiconductor laser of the invention. In FIG. 9, the horizontal axis represents the oscillation wavelength $\lambda$ of the semiconductor laser and the vertical axis represents the relative intensity.

Thin lines "a" represent possible oscillation modes within the semiconductor laser gain curve (without the diffraction grating), and a thick line "b" and a broken line "c" represent single-mode oscillation modes that occur when predetermined currents are caused to flow through the top p-type electrodes 12A and 12B (see FIG. 8).

For example, if the same current that enables laser oscillation is caused to flow through each of the top p-type electrodes 12A and 12B, because of the filtering effect of the diffraction grating 9, the DFB semiconductor laser emits laser light having a prescribed wavelength corresponding to the current value, for example, the wavelength of the thick line b in FIG. 9.

Under such a situation, the wavelength is shifted to the shorter wavelength side or the longer wavelength side by changing the currents flowing through the top p-type electrodes 12A and 12B. For example, when a shift occurs to the shorter wavelength side, laser light having the wavelength of the broken line c in FIG. 9 is emitted.

Specifically, the laser oscillation wavelength is shifted to the shorter wavelength side (leftward in FIG. 9) when the following relationship is satisfied:

(current value of top p-type electrode 12A)<(current value of top p-type electrode 12B)   (2).

The laser oscillation wavelength is shifted to the longer wavelength side (rightward in FIG. 9) when the following relationship is satisfied:

(current value of top p-type electrode 12A)<(current value of top p-type electrode 12B)   (3).

That is, in the DFB semiconductor laser of the present invention, the wavelength varying control can be performed only by varying the currents flowing through the top p-type electrodes 12A and 12B. This wavelength varying control of the DFB semiconductor laser of the invention relates to the width of the ridge stripe.

Figure 10:
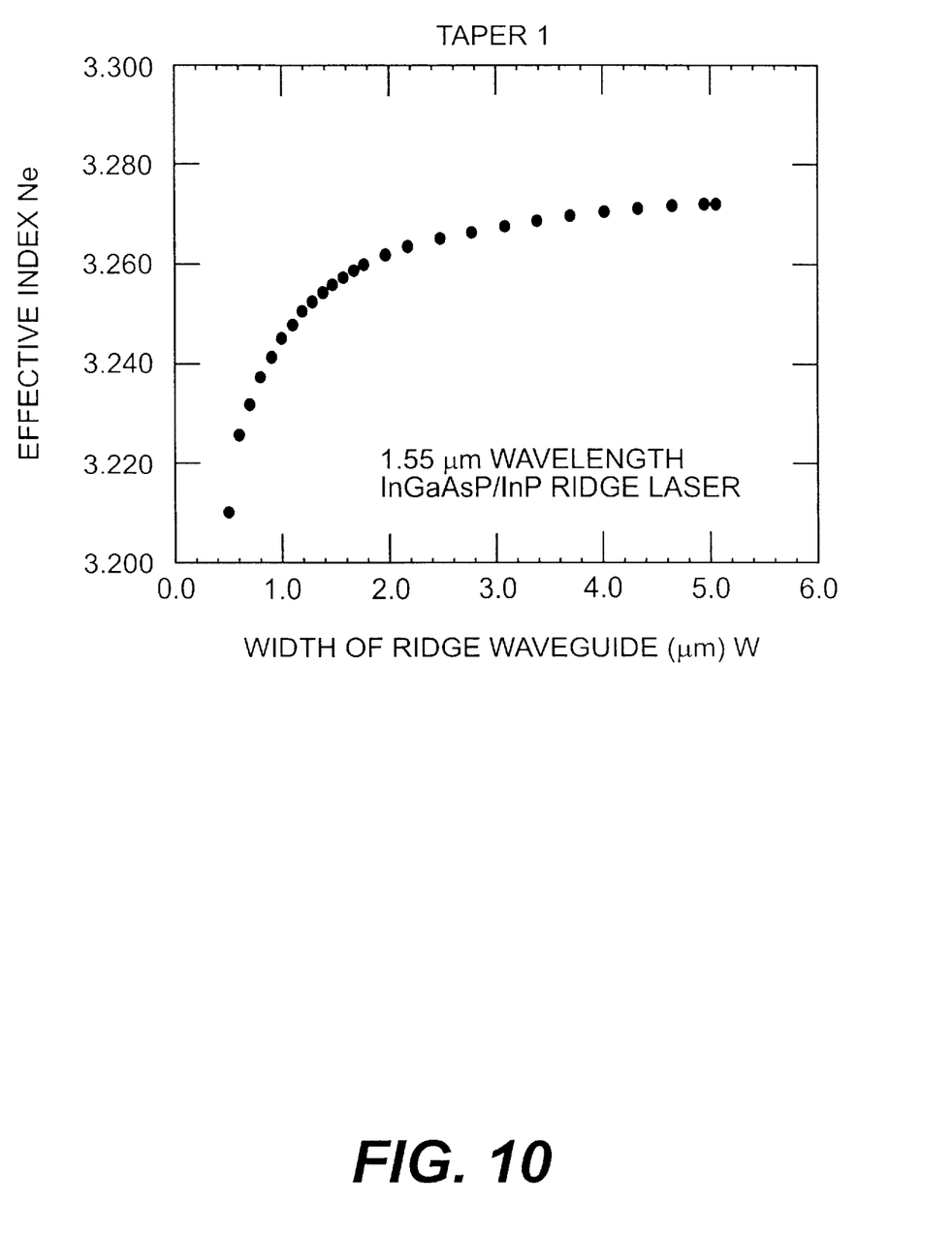
FIG. 10 is a graph showing a relationship between the ridge stripe width of the DFB semiconductor laser of the present invention and the effective refractive index of the DFB semiconductor laser of the present invention.

FIG. 10 shows a variation in effective refractive index $n_e$ due to a variation in the ridge stripe width W of the DFB semiconductor laser of the invention. In FIG. 10, the horizontal axis represents the ridge stripe width W and the vertical axis represents the effective refractive index $n_e$ of the entire semiconductor laser. As shown in FIG. 10, the effective refractive index $n_e$ decreases as the ridge stripe width W decreases.

Since the pitch $\Lambda$ of the diffraction grating of the DFB semiconductor laser is given by the above Equation (1), the oscillation wavelength $\lambda$ satisfies $$\lambda = 2n\Lambda/m \quad (4).$$

The refractive index of the DFB semiconductor laser of the invention is determined by geometrical structures such as the shapes of the respective layers of the semiconductor laser, physical structures of the layers of the SCH structure region, the cladding layer, the contact layer, the insulator layer, etc., and other factors. The effective refractive index $n_e$ is defined so as to include the refractive indices relating all of those factors.

Therefore, the oscillation wavelength of the DFB semiconductor laser of the invention is given by $$\lambda = 2n_e\Lambda/m \quad (5).$$

It is seen from Equation (5) that the oscillation wavelength of the DFB semiconductor laser varies in proportion to the effective refractive index $n_e$ when the pitch $\Lambda$ of the diffraction grating is constant. That is, the oscillation wavelength becomes shorter as the effective refractive index $n_e$ decreases, and becomes longer as the effective refractive index $n_e$ increases.

Since the effective refractive index $n_e$ varies depending on the ridge stripe width W as described above (see FIG. 10), it is understood from Equation (5) that the oscillation wavelength varies in accordance with the ridge stripe width W.

Since the ridge stripe width W is such that the width $W_f$ of the front end face (laser light emission face) is narrower than the width $W_r$ of the rear end face (see FIG. 5), the wavelength becomes shorter according to Equation (5) if the current values are controlled so as to satisfy Equation (2). Conversely, the wavelength becomes longer if the current values are controlled so as to satisfy Equation (3).

The fact that the effective refractive index $n_e$ varies with the ridge stripe width W as shown in FIG. 10 is due to the above-described geometrical structure of the semiconductor laser. That is, in a portion where the ridge stripe is narrow, the light intensity distribution leaks more to the insulator layers 8 than in a portion where the ridge stripe is wide, and hence a larger part of the insulator layers 8 having a smaller refractive index than the layers constituting the ridge stripe is involved, to lower the entire effective refractive index.

As described above, in the DFB semiconductor laser of the invention, the oscillation wavelength is made variable only by forming the ridge stripe so that it assumes an approximately trapezoidal shape whose bases are perpendicular to the laser light emission direction and controlling the currents flowing through the respective electrodes.

Although in the above embodiment the ridge stripe is formed so as to assume an approximately trapezoidal shape whose bases are perpendicular to the laser light emission direction, the shape of the ridge stripe is not limited to it. The oscillation wavelength can be varied if the ridge stripe has at least two width values.

Although the above embodiment is directed to the lateral coupling ridge-type DFB semiconductor laser, the invention is not limited to such a case and can be applied to all kinds of DFB semiconductor lasers having a diffraction grating inside.

Although in the above embodiment no diffraction grating exists under the ridge stripe, the invention can also be applied to a ridge-type DFB semiconductor laser having a diffraction grating under the ridge stripe.

Although in the above embodiment the diffraction grating has a uniform pitch, the invention can also be applied to a case where the diffraction grating has a non-uniform pitch. In this case, if the non-uniform pitch of the diffraction grating is set so as to become shorter toward the laser light emission side, because of the multiplier effect of the varied ridge stripe width and the non-uniform pitch, a larger wavelength shift is obtained for the same variation in current than in the case of the uniform diffraction grating pitch.

Figure 11:
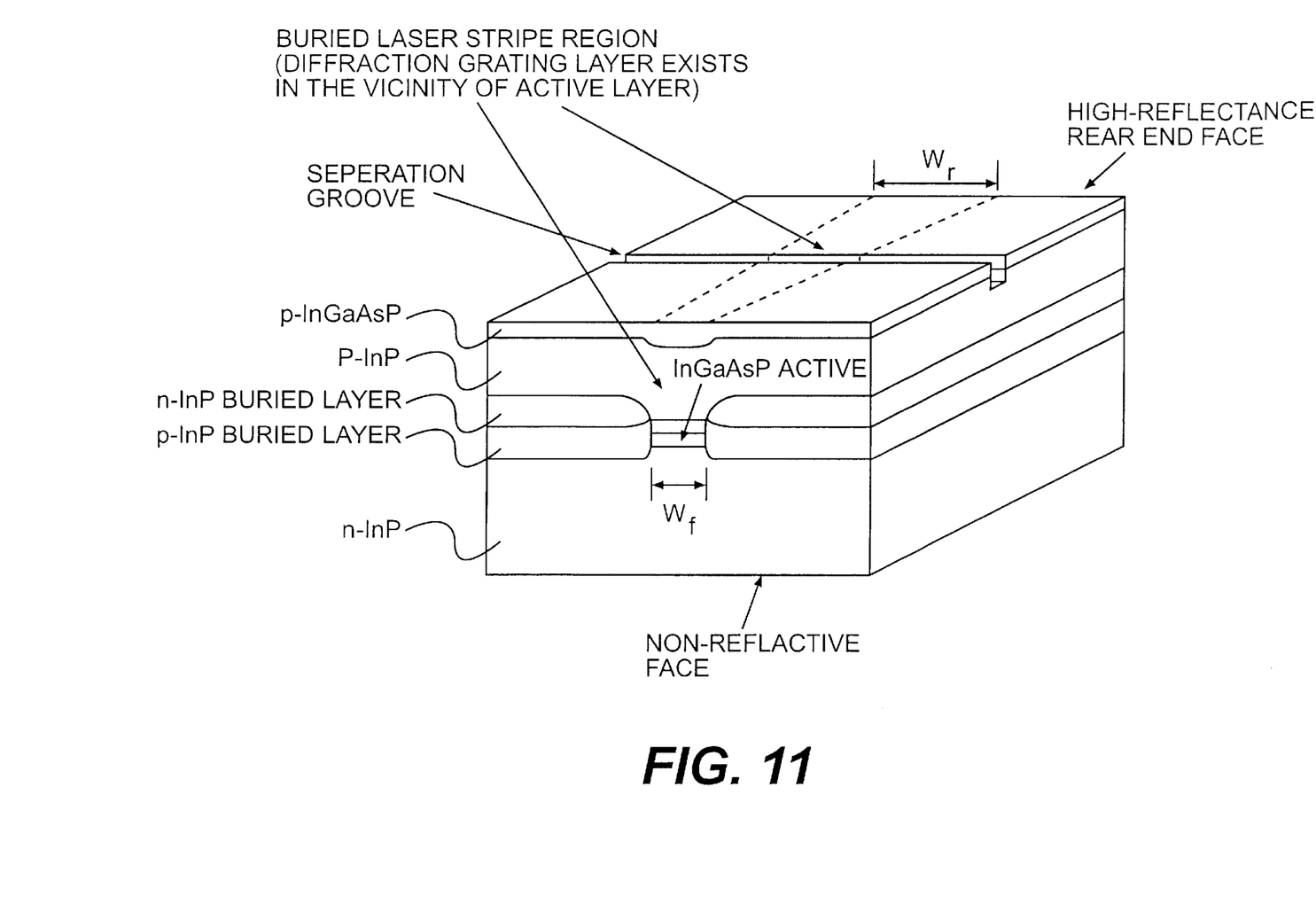
FIG. 11 is a perspective view of a DFB semiconductor laser (before electrode formation) according to another embodiment of the present invention.

The above embodiment is directed to a DFB semiconductor laser having a ridge stripe. FIG. 11 shows another embodiment in which the invention is applied to an active layer buried stripe DFB semiconductor laser. That is, an active layer and all the layers above it are shaped like a trapezoid and a diffraction grating is formed on a guide layer.

In summary, a distributed feedback semiconductor laser has a lamination structure of a semiconductor substrate, an active layer formed on the semiconductor substrate, and layers constituting a ridge stripe and formed on the active layer. A structure that is periodic is formed in a ridge stripe extending direction. A plurality of p-type electrodes are formed on the top surface of the ridge stripe, and an n-type electrode is formed on the bottom surface of the semiconductor substrate. The ridge stripe has a top surface that is parallel with the growth planes of the active layer and the layers constituting the ridge stripe. The top surface of the ridge stripe has at least two different widths in the direction perpendicular to the ridge stripe extending direction.

As described above, in the DFB semiconductor laser according to the invention, the oscillation wavelength of the semiconductor laser is varied only by forming the ridge stripe so as to assume an approximately trapezoidal shape whose bases are perpendicular to the laser light emission direction and controlling currents flowing through the respective electrodes.

The configuration of the DFB semiconductor laser of the instant invention results in a laser that is simple in structure, easy to manufacture (i.e., suitable for mass-production), and small in loss of light. The above distributed feedback laser may be configured in such a manner that the width of the first surface decreases toward a laser light emission side of the semiconductor laser. In the above distributed feedback laser, the first surface may have an approximately trapezoidal shape in which a base on the laser light emission side is shorter than a base on a side opposite to the laser light emission side.

It will be apparent to those skilled in the art that various modifications and variations can be made in the distributed feedback semiconductor laser of the present invention without departing from the spirit or scope of the invention. Thus, it is intended that the present invention cover the modifications and variations of this invention provided they come within the scope of the appended claims and their equivalents.

What is claimed is:

1. A distributed feedback semiconductor laser comprising:
   a semiconductor substrate having a bottom surface and a top surface;
   an active layer formed on the top surface of the semiconductor substrate;
   a ridge stripe forced on the active layer having a first surface and extending in a first direction;
   a periodic structure formed on a surface of the active layer, the periodic structure being periodic in the first direction;
   a plurality of p-type electrodes formed on the first surface of the ridge stripe; and
   an n-type electrode formed on the bottom surface of the semiconductor substrate, wherein the first surface of the ridge stripe is parallel with a growth plane of the active layer, the first surface having at least two different widths in a direction perpendicular to the first direction.

2. The distributed feedback semiconductor laser according to claim 1, wherein the laser has a laser light emission side and the width of the first surface of the ridge stripe gradually decreases along a direction towards the laser light emission side.

3. The distributed feedback semiconductor laser according to claim 1, wherein the first surface has an approximately trapezoidal shape in which a base on the laser light emission side is shorter than a base on a side opposite to the laser light emission side.

4. The distributed feedback semiconductor laser according to claim 1, wherein the ridge stripe includes a plurality of layers including a cladding layer and a contact layer.

5. The distributed feedback semiconductor laser according to claim 1, further comprising a first cladding layer, a first guide layer, a second guide layer, a second cladding layer and a contact layer,
   wherein the first cladding layer and the first guide layer are formed between the semiconductor substrate and the active layer, and the second guide layer, the second cladding layer and the contact layer are formed in order on the active layer such that the active layer is between the first and second guide layers, and
   wherein the ridge stripe includes the second cladding layer and the contact layer.

6. The distributed feedback semiconductor laser according to claim 1, wherein an effective refractive index of the laser varies as the width of the ridge stripe varies.

7. The distributed feedback semiconductor laser according to claim 1, wherein a wavelength of laser light to be emitted is controlled in accordance with an electric current flowing through each of the plurality of p-type electrodes.

8. The distributed feedback semiconductor laser according to claim 1, wherein the periodic structure is a diffraction grating having a uniform pitch.

9. The distributed feedback semiconductor laser according to claim 1, wherein the periodic structure is a diffraction grating having a non-uniform pitch.

10. A distributed feedback semiconductor laser comprising:

a semiconductor substrate;

a first cladding layer formed on the semiconductor substrate;

a first guide layer formed on the first cladding layer;

an active layer formed on the first guide layer;

a second guide layer formed on the active layer;

a second cladding layer formed on the second guide layer;

a contact layer formed on the second cladding layer;

a ridge stripe, formed on a surface of the second guide layer, the ridge stripe including the second cladding layer and the contact layer, and extending in a light emitting direction;

a diffraction grating having a pitch in the light emitting direction and formed on a surface of the second cladding layer;

a plurality of p-type electrodes formed on the ridge stripe; and an n-type electrode formed on a bottom surface of the semiconductor substrate, wherein the ridge stripe has at least two different widths in a direction perpendicular to a ridge stripe extending direction.

11. The distributed feedback semiconductor laser according to claim 10, wherein the width of the ridge stripe gradually decreases along a direction towards a laser light emission side of the semiconductor laser.

12. The distributed feedback semiconductor laser according to claim 10, wherein the ridge stripe has an approximately trapezoidal shape in which a base on a laser light emission side is shorter in width than a base on a side opposite to the laser light emission side.

13. The distributed feedback semiconductor laser according to claim 10, wherein an effective refractive index of the laser varies as the width of the ridge stripe varies.

14. The distributed feedback semiconductor laser according to claim 10, wherein a wavelength of laser light to be emitted is controlled in accordance with an electric current flowing through each of the plurality of p-type electrodes.

15. The distributed feedback semiconductor laser according to claim 10, wherein the diffraction grating has a uniform pitch.

16. The distributed feedback semiconductor laser according to claim 10, wherein the diffraction grating has a non-uniform pitch.

17. A method of manufacturing a distributed feedback semiconductor laser comprising the steps of:

forming a first cladding layer on a semiconductor substrate;

forming a first guide layer on the first cladding layer;

forming an active layer on the first guide layer;

forming a second guide layer on the active layer;

forming a second cladding layer on the second guide layer;

forming a contact layer on the second cladding layer;

providing a ridge stripe on a surface of the second guide layer, the ridge stripe including the second cladding layer and the contact layer, and extending in a light emitting direction;

forming a diffraction grating having a pitch in the light emitting direction on a surface of the second cladding layer;

forming a plurality of p-type electrodes on the ridge stripe; and forming an n-type electrode on a bottom surface of the semiconductor substrate, wherein the step of providing a ridge stripe includes the step of providing the ridge stripe with at least two different widths in a direction perpendicular to a ridge stripe extending direction.

18. The manufacturing method as claimed in claim 17, wherein the step of providing a ridge stripe includes the step of providing the ridge stripe with a width that gradually decreases along a direction towards a laser light emission side of the semiconductor laser.

19. The manufacturing method as claimed in claim 17, wherein the step of providing a ridge stripe includes the step of providing the ridge stripe with an approximately trapezoidal shape in which a base on a laser light emission side is shorter in width than a base on a side opposite to the laser light emission side.

20. The manufacturing method as claimed in claim 17, wherein an effective refractive index of the laser varies as the width of the ridge stripe varies.

* * * * *

UNITED STATES PATENT AND TRADEMARK OFFICE
CERTIFICATE OF CORRECTION

PATENT NO. : 6,301,283 B1  
DATED : October 9, 2001  
INVENTOR(S) : Nong Chen, Kiyoshi Takei, Yoshiaki Watanabe, Kiyofumi Chikuma It is certified that error appears in the above-identified patent and that said Letters Patent is hereby corrected as shown below:

<u>Column 8, claim 1,</u>  
Line 29, delete "forced" and insert -- formed --.

Signed and Sealed this

Second Day of April, 2002

Attest:

JAMES E. ROGAN  
*Director of the United States Patent and Trademark Office*

*Attesting Officer*